US012812803B2

(12) United States Patent
Xiao et al.

(10) Patent No.: US 12,812,803 B2
(45) Date of Patent: Nov. 24, 2026

(54) EXPANSION CARD, MAINBOARD, SERVER, AND EXPANSION CARD MANUFACTURING METHOD

(71) Applicant: Huawei Technologies Co., Ltd., Shenzhen (CN)

(72) Inventors: Weigang Xiao, Dongguan (CN); Ziguo Ma, Dongguan (CN); Kanghua Ou, Dongguan (CN); Jun Yu, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 239 days.

(21) Appl. No.: 18/741,059

(22) Filed: Jun. 12, 2024

(65) Prior Publication Data

US 2024/0334632 A1 Oct. 3, 2024

Related U.S. Application Data

(63) Continuation of application No. PCT/CN2022/138263, filed on Dec. 11, 2022.

(30) Foreign Application Priority Data

Dec. 14, 2021 (CN) ......................... 202111526759.X

(51) Int. Cl.
*H05K 5/02* (2006.01)
*H05K 5/00* (2006.01)

(52) U.S. Cl.
CPC ......... *H05K 5/0247* (2013.01); *H05K 5/0069* (2013.01); *H05K 5/0269* (2013.01)

(58) Field of Classification Search
CPC .. H05K 5/0247; H05K 5/0069; H05K 5/0269; H05K 3/30; H01R 13/6471; H01R 12/721; H01R 43/02; H01R 13/02; H01R 13/502; H01R 12/71; H01R 13/40; H01R 13/648; H01R 24/00; H01R 2201/06;
(Continued)

(56) References Cited

U.S. PATENT DOCUMENTS

| | | | |
|---|---|---|---|
| 6,089,878 | A | 7/2000 | Meng |
| 6,655,976 | B1 | 12/2003 | Shipe et al. |
| 2008/0200043 | A1 | 8/2008 | Yeh |

(Continued)

FOREIGN PATENT DOCUMENTS

| | | | |
|---|---|---|---|
| CN | 2624429 | Y | 7/2004 |
| CN | 103163974 | A | 6/2013 |

(Continued)

*Primary Examiner* — Timothy J Thompson
*Assistant Examiner* — Sidi M Maiga
(74) *Attorney, Agent, or Firm* — Conley Rose, P.C.

(57) ABSTRACT

An expansion card includes a circuit board, a connector component, and a plurality of cables. The connector component includes a first connector and a second connector that are disposed on the circuit board, where the first connector and the second connector are fastened together, and the first connector is configured to be connected to a plug-in card. One end of each of the plurality of cables is separately welded to terminals of the first connector and the second connector, and the other end of the cables is configured to be electrically connected to a first pairing connector and a second pairing connector of a mainboard.

20 Claims, 7 Drawing Sheets

(58) Field of Classification Search
CPC ........... G06F 2213/0026; G06F 13/409; G06F 13/4282; G06F 1/18
USPC ........................................................ 174/59
See application file for complete search history.

(56) References Cited

U.S. PATENT DOCUMENTS

| | | | | |
|---|---|---|---|---|
| 2010/0153608 | A1* | 6/2010 | Olesiewicz | H05K 7/1487 710/303 |
| 2012/0246372 | A1 | 9/2012 | Chang | |
| 2013/0151745 | A1* | 6/2013 | Yin | G06F 1/189 710/301 |
| 2015/0169013 | A1* | 6/2015 | Lai | G06F 1/20 361/679.02 |
| 2017/0133777 | A1* | 5/2017 | Little | H01R 12/721 |
| 2023/0007773 | A1 | 1/2023 | Zhang et al. | |

FOREIGN PATENT DOCUMENTS

| | | | |
|---|---|---|---|
| CN | 203276112 | U | 11/2013 |
| CN | 107658583 | A | 2/2018 |
| CN | 109446137 | A | 3/2019 |
| CN | 209169534 | U | 7/2019 |
| CN | 109361116 | B | 8/2020 |
| CN | 113395819 | A | 9/2021 |

* cited by examiner

EXPANSION CARD, MAINBOARD, SERVER, AND EXPANSION CARD MANUFACTURING METHOD

CROSS-REFERENCE TO RELATED APPLICATIONS

This is a continuation of International Patent Application No. PCT/CN2022/138263, filed on Dec. 11, 2022, which claims priority to Chinese Patent Application No. 202111526759.X, filed on Dec. 14, 2021. The disclosures of the aforementioned applications are hereby incorporated by reference in their entireties.

TECHNICAL FIELD

This application relates to the field of server technologies, and in particular, to an expansion card, a mainboard, a server, and an expansion card manufacturing method.

BACKGROUND

With continuous improvement of computing power of a server, Peripheral Component Interconnect Express (PCIe) resources of a server mainboard are increasing, and using the PCIe resources in a hard-connection expansion card (for example, a riser card) manner is a key technology in current server design. When the expansion card is connected to the mainboard, a first connector may be disposed on the expansion card side, a first pairing connector cooperatively connected to the first connector may be disposed on the mainboard side, and the first connector is connected to the first pairing connector through a cable.

A subboard configured to carry the first connector is generally disposed on the expansion card, the first connector is disposed on the subboard, and a terminal of the first connector is connected to a wire disposed on the subboard. One end of the cable is connected to the wire of the subboard, and the other end is connected to the first pairing connector on the mainboard, to implement connection between the first connector and the first pairing connector, thereby implementing connection between the expansion card and the mainboard. In this connection manner, because the wire needs to be disposed on the subboard to implement connection between the first connector and the cable, a wiring loss and an impedance discontinuity point are caused, and quality of signal transmission is affected. In addition, because a speed of a signal to be transmitted between the expansion card and the mainboard is high, when the wire of the subboard is used for transfer, to meet a transmission requirement of the high-speed signal, a performance requirement of the subboard is also high, so that overall costs of the expansion card are high.

SUMMARY

This application provides an expansion card, a mainboard, a server, and an expansion card manufacturing method, to improve quality of signal transmission between the expansion card and the mainboard, and reduce manufacturing costs of components of a circuit board.

According to a first aspect, an expansion card is provided. The expansion card may include a circuit board, a connector component, and a plurality of cables. The connector component may include a first connector and a second connector, the first connector and the second connector are fastened together, and the first connector is configured to be connected to a plug-in card. One end of each of the plurality of cables is separately welded to terminals of the first connector and the second connector, and the other end is configured to be electrically connected to a first pairing connector and a second pairing connector of a mainboard, to transmit signals between the expansion card and the mainboard.

In comparison with a technology in which transferring needs to be implemented by using a wire of the circuit board, the manner in which the first connector and the second connector are directly welded to the cable in this application cannot only omit a subboard provided with a transferring wire, and reduce production costs of the expansion card, but also reduce a link loss and impedance discontinuity points, and improve quality of signal transmission.

In a possible implementation, a storage chip may be disposed on the circuit board, and the storage chip may be configured to store identifier (ID) information of the first connector. The second connector is electrically connected to the storage chip, and is configured to transmit the ID information of the first connector to the mainboard through the cable, so that the mainboard detects, based on the ID information of the first connector, whether the first connector matches a currently connected first pairing connector.

In another possible implementation, the first connector may include a first housing and two first terminal modules, and the first housing is fastened to the circuit board. The two first terminal modules are disposed in the first housing, and the two first terminal modules are spaced, so that a slot for installing a plug-in card can be formed between the two first terminal modules. When the plug-in card is inserted into the slot, electrical connections to the first terminal modules on the two sides can be implemented.

In another possible implementation, the first terminal module may include a plurality of first terminals that are disposed in parallel, a first end of the first terminal may be welded to the cable, and a second end of the first terminal has a first bending part. In an example disposition, the first bending part may include a first connection section and a second connection section that are disposed sequentially away from the first end of the first terminal, the first connection section and the second connection section are disposed at an included angle, and included angles of first bending parts of the two first terminal modules are disposed opposite to each other. In this way, when the plug-in card is inserted into the slot, two sides of the plug-in card may elastically abut against the first bending parts of the first terminals on the two sides, so that the plug-in card can be electrically connected to the first terminal.

In another possible implementation, the first housing may include a first side wall, a second side wall, a third side wall, and a fourth side wall. The first side wall is opposite to the second side wall, the third side wall is opposite to the fourth side wall, a first groove is disposed on an inner surface of the third side wall, and a second groove is disposed on an inner surface of the fourth side wall. The two first terminal modules are respectively disposed close to the third side wall and the fourth side wall, and the first end and the second end of the first terminal respectively extend toward the first side wall and the second side wall. A second connection section of a first terminal of a first terminal module on a side of the third side wall may extend into the first groove, and a second connection section of a first terminal of a first terminal module on a side of the fourth side wall may extend into the second groove. When the plug-in card is inserted into the slot, the first terminals on the two sides may be elastically deformed under a pressure of the plug-in card, so that the second connection section moves toward a corresponding slot.

In another possible implementation, an inner wall that is of the first groove and that is on a side close to the second side wall has a first slope, and the first slope may gradually tilt toward the second side wall along a direction from a groove opening to a groove bottom of the first groove. The first slope may abut against the second connection section of the first terminal extending into the first groove, and a surface contact may be formed between the first slope and the second connection section, to improve structural stability of the first terminal module on the side of the third side wall in the first housing. A side of the second groove close to the second side wall has a second slope, and the second slope also gradually tilts toward the second side wall along a direction from a groove opening to a groove bottom of the second groove. The second slope may abut against the second connection section of the first terminal extending into the second groove, and a surface contact may be formed between the second slope and the second connection section, to improve structural stability of the first terminal module on the side of the fourth side wall in the first housing.

In another possible implementation, in some optional implementation solutions, an extension direction of the first terminal is defined as a first direction, and an included angle between the first slope and the first direction is less than or equal to 30°. In this way, an included angle between the second connection section of the first terminal and the first direction may also be small, so that a risk of pin collapse of the first terminal on the side of the third side wall can be reduced. Similarly, an included angle between the second slope and the first direction may also be designed to be less than or equal to 30°, to reduce a risk of pin collapse of the first terminal on the side of the fourth side wall.

In another possible implementation, a first terminal of each first terminal module may include a plurality of ground terminals, and a plug-in hole may be disposed on the ground terminal. The first terminal module may further include a grounding assembly. The grounding assembly may include a support and a plurality of plug-in parts disposed on one side of the support. These plug-in parts may be respectively inserted into plug-in holes of the ground terminals, to electrically connect the plurality of ground terminals.

In another possible implementation, the second connector may include a second housing and a plurality of second terminals disposed in the second housing, and the second housing may be fastened to one side of the first housing. A first end of the second terminal may be welded to the cable, and a second end of the second terminal protrudes from a surface of the second housing. When the second terminal is elastically deformed due to pressure, the second end of the second terminal may move toward the second housing.

In another possible implementation, the circuit board may include a first surface and a second surface opposite to each other, a through groove that runs through the first surface to the second surface is disposed on the circuit board, and a pad is disposed on the second surface of the circuit board. The first connector may be exposed to the second surface through the through groove from the first surface, the second connector is located on the second surface, the second end of the second terminal is disposed toward the first surface of the circuit board, and the second end of the second terminal may elastically abut against the pad of the first surface, to implement electrical connection between the second connector and the circuit board.

In another possible implementation, the connector component may further include a base, the base has an accommodating cavity, and the base is provided with a hole that connects the accommodating cavity to the outside. The first housing and the second housing may be separately fastened to the base, and the first end of the first terminal and the first end of the second terminal may be separately disposed toward the accommodating cavity; and one end of the cable may extend into the accommodating cavity and is welded to the first terminal and the second terminal, and the other end may extend through the hole and is connected to the mainboard side. The base is disposed to facilitate convergence of the plurality cables and simplify a subsequent cabling process.

In another possible implementation, the first housing may be fastened to the circuit board by using a fastener.

In another possible implementation, the base may be located on the first surface of the circuit board, the base is fastened to the circuit board, and the second connector may be fastened between the base and the circuit board. In this way, when the base is fastened to the circuit board, the second connector may elastically abut against the circuit board, so that the second terminal elastically abuts against the pad on the circuit board.

In another possible implementation, there may be a plurality of first connectors, and a height difference between parts that are of any two first connectors and that exceed the circuit board falls within a preset range. These first connectors may include the foregoing first connector that is integrated with the second connector, or may include a first connector that is surface-mounted on the circuit board, so that both a surface-mounted connector and an integrated connector component solution can be implemented on the expansion card, to make product design more flexible.

In another possible implementation, the first connector may be a Card Electromechanical (CEM) connector.

According to a second aspect, this application further provides a mainboard. The mainboard may be electrically connected to the expansion card in any optional implementation solution of the first aspect. A first pairing connector and a second pairing connector are disposed on the mainboard, the first pairing connector is connected to the first connector through the cable, and the second pairing connector is connected to the second connector through the cable. Because the cable is directly welded to both the first connector and the second connector on the expansion card side, a link loss and impedance discontinuity points can be reduced, and quality of signal transmission can be improved.

In a possible implementation, the first pairing connector and the second pairing connector may be of an integrated structure. Alternatively, the first pairing connector and the second pairing connector may be of a separated structure, that is, the first pairing connector and the second pairing connector are disposed independently.

According to a third aspect, a server is provided. The server may include a cabinet and the expansion card in any one of the first aspect or the possible implementations of the first aspect, and the expansion card is disposed in the cabinet. On the expansion card, the first connector and the second connector are directly welded to the cable. This cannot only omit a subboard provided with a transferring wire, and reduce production costs of the expansion card, but also reduce a link loss and impedance discontinuity points, and improve quality of signal transmission.

In another possible implementation, the server may further include a mainboard, a first pairing connector and a second pairing connector are disposed on the mainboard, the first pairing connector is connected to the first connector through the cable, and the second pairing connector is connected to the second connector through the cable.

According to a fourth aspect, this application further provides an expansion card manufacturing method. The manufacturing method may include the following steps: separately welding terminals of a first connector and a second connector to a plurality of cables; fastening the first connector and the second connector together to form a connector component; and fastening the connector component on a circuit board.

In the foregoing solution, the first connector and the second connector are directly welded to the cable. This cannot only omit a subboard provided with a transferring wire, and reduce production costs of the expansion card, but also reduce a link loss and impedance discontinuity points, and improve quality of signal transmission.

DESCRIPTION OF EMBODIMENTS

To make the objectives, technical solutions, and advantages of this application clearer, the following further describes this application in detail with reference to the accompanying drawings.

With continuous improvement of computing power of a server, PCIe resources of a mainboard of the server are increasing. How to make full use of the PCIe resources of the mainboard to expand to more PCIe cards has become a key technology for server design. In current server design, a PCIe resource is usually used by using a hard-connection expansion card.

Figure 1:
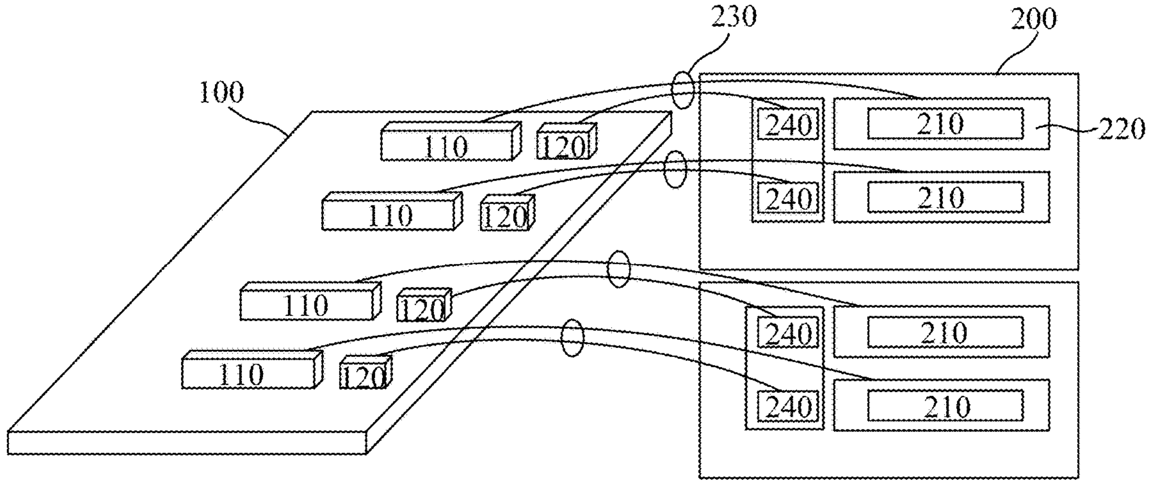
FIG. 1 is a schematic diagram of a partial structure of a possible server.

FIG. 1 is a schematic diagram of a partial structure of a possible server. Referring to FIG. 1, the server may include a mainboard 100 and an expansion card 200, a first connector 210 is disposed on the expansion card 200, a first pairing connector 110 cooperating with a first connector 210 is disposed on the mainboard 100, and the first connector 210 is electrically connected to the first pairing connector 110 through a cable 230. During an example implementation, the first connector 210 may be configured to insert a plug-in card, to transfer a high-speed signal on the plug-in card to the first pairing connector 110 that is transferred to the mainboard 100 through the cable. In an example, the first connector may also be referred to as a high-speed connector. For example, the first connector may be a connector (for example, a PCIe CEM) defined in the standard, and the plug-in card may include but is not limited to an add-in-card (AIC) standard card, an Open Compute Project (OCP) standard card, a non-volatile memory host controller interface specification such as a Non-Volatile Memory Express (NVMe) hard disk, or the like.

When the first connector 210 is connected to the first pairing connector 110, a subboard 220 is generally disposed on the expansion card 200, and the subboard 220 has a wire. The first connector 210 may be disposed on the subboard 220, and a terminal of the first connector 210 is electrically connected to the wire disposed on the subboard 220. One end of the cable 230 is connected to the wire on the subboard, and the other end is connected to the first pairing connector 110 on the mainboard 100, to implement connection between the first connector 210 and the first pairing connector 110, thereby implementing connection between the expansion card 200 and the mainboard 100. In this connection manner, a wire needs to be disposed on the subboard 220 to implement connection between the first connector 210 and the cable 230, causing a wiring loss and an impedance discontinuity point, and quality of signal transmission is affected. In addition, because speed of a signal to be transmitted between the expansion card 200 and the mainboard 100 is high, when the wire of the subboard 220 is used for transfer, to meet a transmission requirement of the high-speed signal, a performance requirement of the subboard 220 is also high, so that overall costs of the expansion card 200 are high.

In addition, there are usually a plurality of first connectors 210 on the expansion card 200, to install a plurality of plug-in cards. Correspondingly, there are also a plurality of first pairing connectors 110 on the mainboard 100. The plurality of first connectors 210 are connected to the plurality of first pairing connectors 110 in a one-to-one correspondence, to separately connect the plug-in cards to the mainboard 100. In this case, when the first connector 210 is connected to the first pairing connector 110 through the cable 230, there is a risk that the first connector 210 connected to two ends of the cable 230 does not match the first pairing connector 110. To reduce this risk, second connectors 240 respectively corresponding to the plurality of first connectors 210 may be further disposed on the expansion card 200. Correspondingly, second pairing connectors 120 respectively corresponding to the plurality of second connectors 240 may be disposed on the mainboard 100, and the second connector 240 may also be connected to the second pairing connector 120 through the cable 230. The second connector 240 may be configured to transmit ID information of the corresponding first connector 210 to the mainboard by using the second pairing connector 120. Because speed of the transmitted signal is low, the second connector 240 may also be referred to as a low-speed connector. On the mainboard 100 side, a related control chip (for example, a logic chip such as a complex programmable logic device (CPLD)) on the mainboard 100 may compare the ID information of the first connector 210 with ID information of a currently connected first pairing connector 110, to detect whether the first connectors 210 and the first pairing connector 110 at two ends of the cable 230 match. Although this design can implement a matching detection function, an independent low-speed signal cable 230 needs to be added to connect the second connector 240 to the second pairing connector 120, resulting in high cable costs. In addition, because the first connector 210 and a second connector component 40 are disposed independently, subsequent assembly and cabling processes are also complex.

To resolve the foregoing problem, in embodiments of this application, a structure of the expansion card is improved. The first connector is directly connected to the cable, so that the subboard provided with the transferring wire is omitted. This not only can reduce a link loss, enable the server to support evolution at a higher rate, but also can reduce production costs of the expansion card. In addition, the expansion card may integrate the first connector and the second connector, to reduce connection cables between the expansion card and the mainboard, thereby reducing cable costs and simplifying subsequent assembly and cabling processes. The following further describes in detail embodiments of this application with reference to accompanying drawings.

Figure 2:
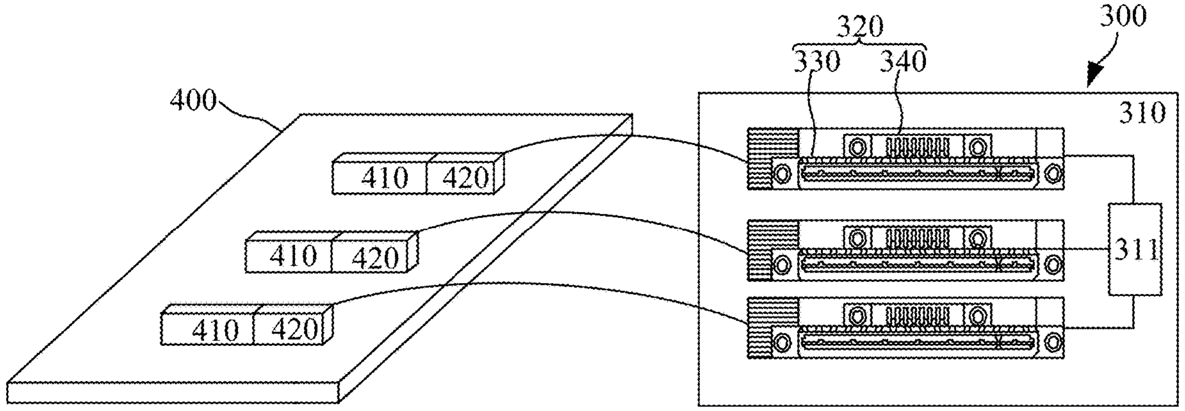
FIG. 2 is a schematic diagram of a partial structure of a server according to an embodiment of this application.

FIG. 2 is a schematic diagram of a partial structure of a server according to an embodiment of this application. Referring to FIG. 2, the server provided in this embodiment of this application may be a rack server or a cabinet server, and the server may include a cabinet and an expansion card 300 and a mainboard 400 that are disposed in the cabinet. The expansion card 300 may include a circuit board 310 and a connector component 320 fastened on a circuit board 310. The connector component 320 is of a combined structure obtained by integrating a first connector 330 and a second connector 340. The first connector 330 and the second connector 340 may be a high-speed connector and a low-speed connector respectively. A quantity of connector components 320 is not limited. FIG. 2 shows an example in which the expansion card 300 includes three connector components 320. It should be understood that in an actual application, the quantity of connector components 320 may be greater than or less than three. This is not limited in this embodiment of this application. In an example design, the plurality of connector components 320 may be arranged in an array on the circuit board 310. The circuit board 310 may be a rigid circuit board, or may be a flexible circuit board, or may be a rigid-flex circuit board. It may be understood that, when the circuit board 310 is a flexible substrate or a rigid-flex substrate, a stiffening plate may be disposed on one side of the circuit board 310, to reliably support the connector component 320. A storage chip 311 may be disposed on the circuit board 310. The storage chip 311 may be electrically connected to each connector component 320, and is configured to store ID information of a first connector 330 of each connector component 320.

The mainboard 400 is provided with a first pairing connection 410 and a second pairing connector 420 that are respectively cooperatively connected to the first connector 330 and the second connector 340, and the first connector 330 is electrically connected to the first pairing connector 410 through a cable 350, and the second connector 340 is electrically connected to the second pairing connector 420 through the cable 350. During an example disposition, the first pairing connector 410 and the second pairing connector 420 may be of the integrated structure shown in FIG. 2, or may be of the independently-disposed separated structure shown in FIG. 1. This is not limited in this embodiment of this application.

Figure 3:
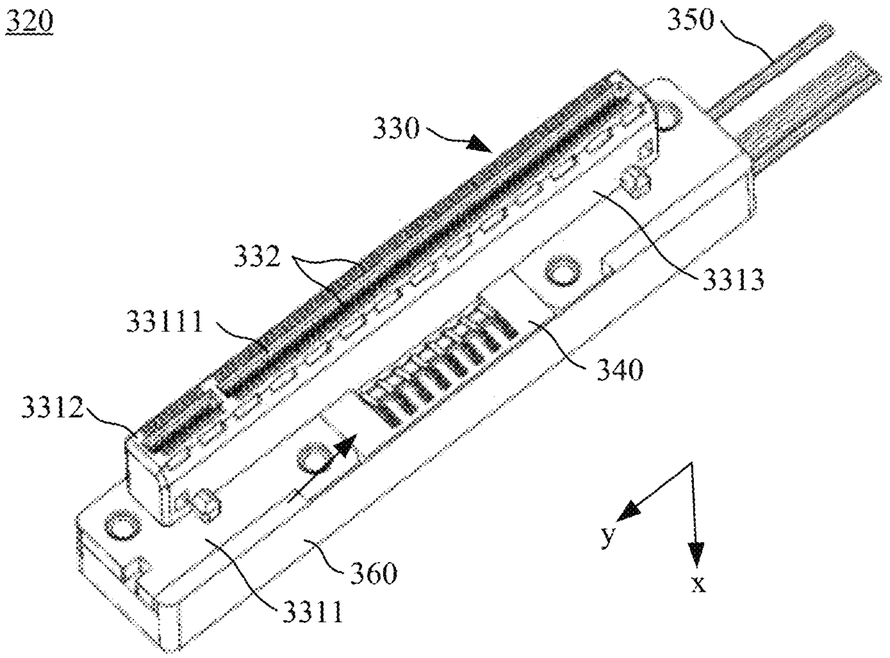
FIG. 3 is a schematic diagram of a structure of a connector component according to an embodiment of this application.

FIG. 3 is a schematic diagram of a structure of a connector component according to an embodiment of this application. Referring to FIG. 3, the connector component 320 may further include a base 360. The base 360 is fastened to the circuit board, and the first connector 330 and the second connector 340 may be separately disposed on the base 360. For example, the first connector 330 and the second connector 340 may be located on a same side of the base 360. The base 360 has an accommodating cavity, and the accommodating cavity may be configured to accommodate and wrap the cable 350. One end of the base 360 is provided with a hole for connecting the accommodating cavity to the outside. One end of the cable 350 may be connected to the first connector 330 and the second connector 340, and the other end may extend to the outside of the base 360 through the hole to connect to the mainboard.

Figure 4:
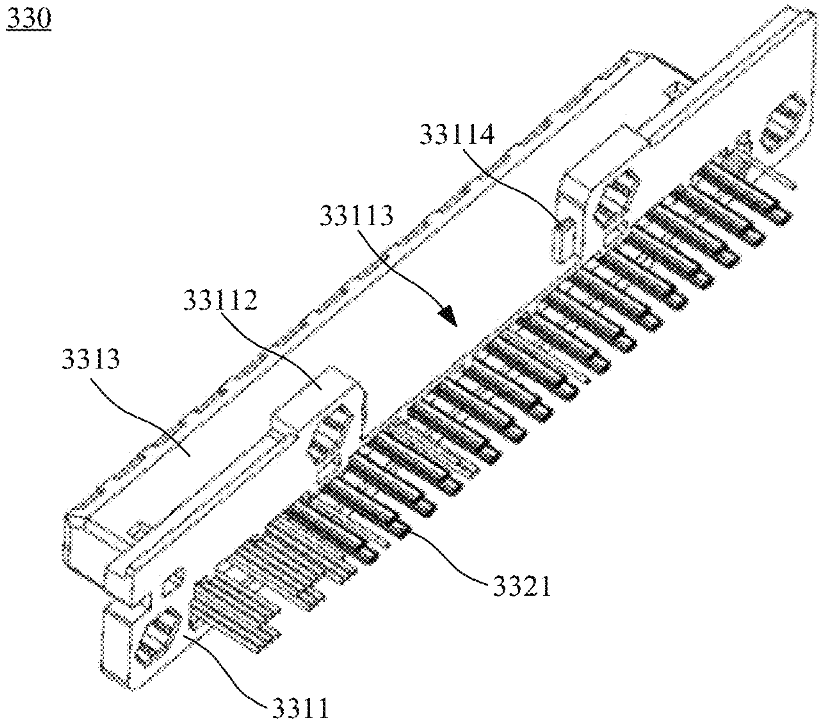
FIG. 4 is a schematic diagram of a structure of a first connector according to an embodiment of this application.

FIG. 4 is a schematic diagram of a structure of a first connector according to an embodiment of this application. Referring to FIG. 3 and FIG. 4, the first connector 330 may include a first housing 331 and two first terminal modules 332, and the two first terminal modules 332 are disposed in the first housing 331. The first housing 331 may be made of a plastic material. The first housing 331 may be approximately of a hexahedron structure, and includes a first side wall 3311, a second side wall 3312, a third side wall 3313, and a fourth side wall (not shown in the figure). The first side wall 3311 is fastened to the base 360, the first side wall 3311 is opposite to the second side wall 3312, the third side wall 3313 is opposite to the fourth side wall, and the third side wall 3313 and the fourth side wall are respectively connected between the first side wall 3311 and the second side wall 3312. The first side wall 3311 and the second side wall 3312 may be separately provided with a first opening 33111, and two ends of the two first terminal modules 332 may be respectively exposed to the two first openings 33111 of the first side wall 3311 and the second side wall 3312. For example, one first terminal module 332 may be disposed close to the third side wall 3313, the other first terminal module 332 may be disposed close to the fourth side wall, and the two first terminal modules 332 are spaced. In this case, a slot 333 of the first connector 330 may be formed between the two first terminal modules 332, and the foregoing plug-in card may be inserted into the slot 333 from the first opening 33111 of the second side wall 3312 along a first direction (x direction). Two sides of the plug-in card may be electrically connected to and abut against the two first terminal modules 332 respectively.

In some possible embodiments, an extension part 33112 may be further disposed on a periphery of the first side wall 3311. The extension part 33112 may extend in a direction away from the first housing 331. A card slot 33113 is disposed on the extension part 33112. The second connector 340 may be disposed in the card slot 33113, so that the first connector 330 and the second connector 340 are combined into an integrated structure.

Figure 5:
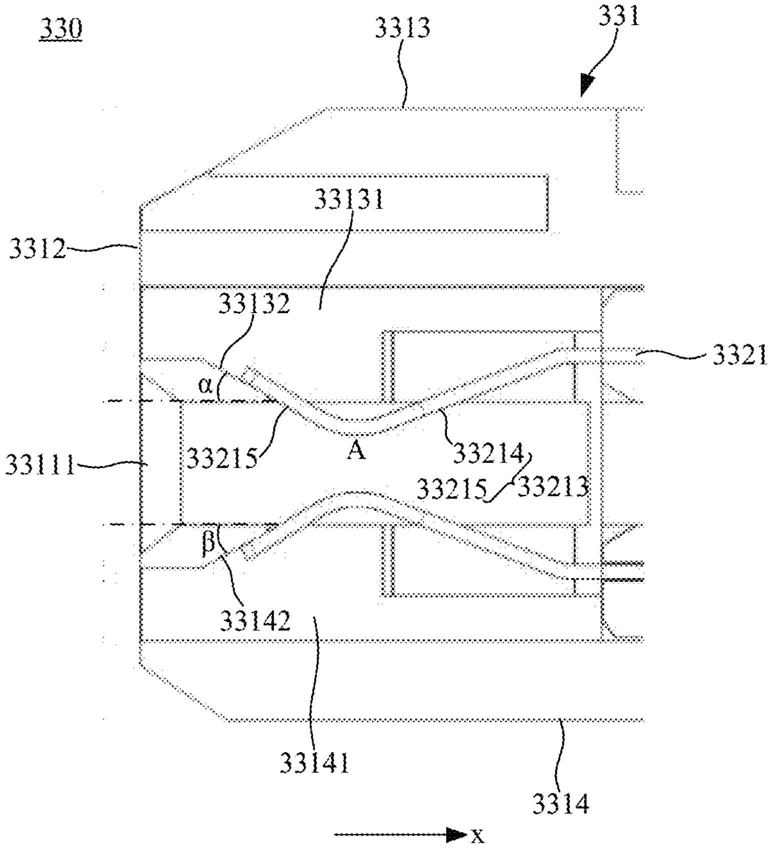
FIG. 5 is a partial sectional view of a first connector according to an embodiment of this application.
Figure 6:
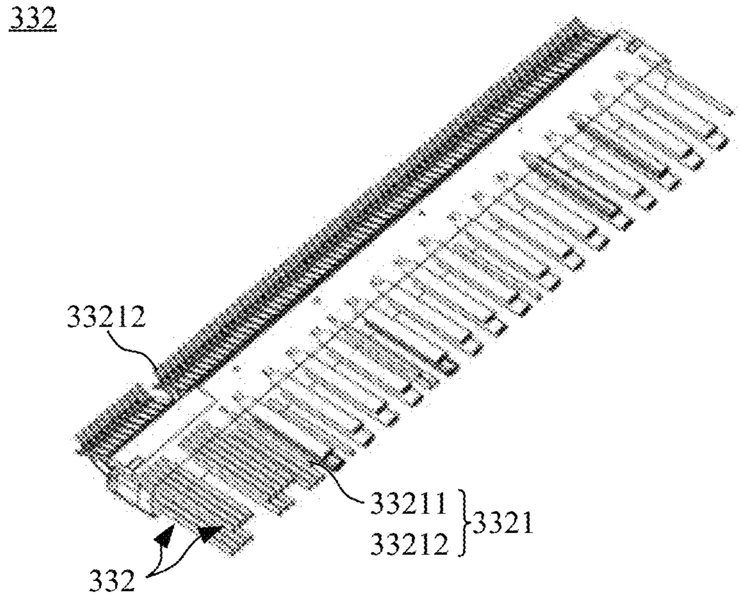
FIG. 6 is a schematic diagram of a structure of a first terminal module according to an embodiment of this application.

Referring to FIG. 5 and FIG. 6, FIG. 5 is a partial sectional view of a first connector according to an embodiment of this application, and FIG. 6 is a schematic diagram of a partial structure of a first terminal module according to an embodiment of this application. The first terminal module 332 may include a plurality of first terminals 3321 disposed in parallel in a second direction (y direction), and the first terminals 3321 have a first end 33211 and a second end 33212 that respectively extend toward the first side wall 3311 and the second side wall 3312. The first end 33211 of the first terminal 3321 may be connected to the cable in the base through the first opening 33111 of the first side wall 3311. For example, the first end 33211 of the first terminal 3321 may be welded to the cable, to implement electrical connection between the first terminal 3321 and the cable on a basis that the first terminal 3321 is fastened to the cable. In comparison with the current technology in which transferring needs to be implemented by using a wire of the circuit board, the first terminal 3321 and the cable are directly welded in this embodiment. This not only can omit the subboard provided with the transferring wire, and reduce production costs of the expansion card, but also can reduce a link loss and an impedance discontinuity point. Simulation and tests show that in the application of PCIe 5.0, a signal loss of the first connector 330 can be reduced by more than 1 dB, and crosstalk can be reduced by more than 5 dB.

In addition, in the current technology, in the manner of transferring by using the wire of the subboard, the first end 33211 of the first terminal 3321 needs to extend to a surface of the subboard to connect to the wire on the subboard. In an example, a length of the first terminal 3321 is long, and consequently, a length of a signal return path in the first connector 330 is also long. However, in this embodiment, the first terminal 3321 is directly welded to the cable, and there is no requirement on an extension position of the first end 33211 of the first terminal 3321. In an example, the length of the first terminal 3321 may be correspondingly reduced, thereby helping reduce a length of the signal return path, and reduce the signal loss and crosstalk of the first connector 330.

Still Referring to FIG. 5 and FIG. 6, the second end 33212 of the first terminal 3321 has a first bending part 33213, the first bending part is approximately of an angular structure, and includes a first connection section 33214 and a second connection section 33215 that are disposed at an included angle. The second connection section 33215 is located at a tail end of the first terminal 3321. In the two opposite first terminal modules 332, a corner of a first terminal 3321 of an upper first terminal module 332 may be disposed facing a lower first terminal module 332, a corner of a first terminal 3321 of the lower first terminal module 332 may be disposed facing the upper first terminal module 332, and the corner of the first terminal 3321 of the upper first terminal module 332 is opposite to the corner of the first terminal 3321 of the lower first terminal module 332. In this case, a gap may be formed between the corner of the upper first terminal 3321 and the corner of the lower first terminal 3321, and a height of the gap may be less than a thickness of the plug-in card. When the plug-in card is inserted between the two first terminal modules 332 from the first opening 33111 of the second side wall 3312, two sides of the plug-in card may elastically abut against the corners of the upper and lower first terminals 3321, so that the plug-in card can be electrically connected to the first terminal 3321, that is, the plug-in card is electrically connected to the first terminal module 332. It should be noted that the orientation terms such as "upper" and "lower" used for the first connector 330 in this embodiment of this application are mainly described based on a display orientation of the first connector 330 in FIG. 5, and do not constitute a limitation on an orientation of the first connector 330 in an actual application scenario.

In some embodiments, a first groove 33131 is disposed on a side that is of the third side wall 3313 and that faces the fourth side wall 3314, and the first groove 33131 is located at an end that is of the third side wall 3313 and that is close to the second side wall 3312. An inner wall that is of the first groove 33131 and that is on a side close to the second side wall 3312 has a first slope 33132, and the first slope 33132 gradually tilts toward the second side wall 3312 along a direction from a groove opening to a bottom of the first groove 33131. When the first terminal module 332 on a side of the third side wall 3313 is installed into the first housing 331, a second connection section 33215 of each first terminal 3321 of the first terminal module 332 may extend into the first groove 33131, and a part of the second connection section 33215 extending into the first groove 33131 may abut against the first slope 33132 of the first groove 33131.

For example, an included angle $\alpha$ between the first slope 33132 and the first direction x may not be less than an included angle between the second connection section 33215 in a natural state and the first direction x. In this way, when the second connection section 33215 extends into the first groove 33131, elastic deformation can be generated under a pressure of the first slope 33132, so that an included angle between the deformed second connection section 33215 and the first direction x is approximately equal to $\alpha$. In this case, surface contact may be formed between the second connection section 33215 and the first slope 33132, so that structural stability of the upper first terminal module 332 in the first housing 331 is improved. In an example design, the included angle $\alpha$ between the first slope 33132 and the first direction x may not be greater than 30°. In this way, the included angle between the second connection section 33215 of the first terminal 3321 and the first direction x may also be small, so that structural reliability of the first terminal 3321 is improved, and a risk of pin collapse of the first terminal 3321 is reduced.

Similarly, a second groove 33141 may be disposed on a side that is of the fourth side wall 3314 and that faces the third side wall 3313, and the second groove 33141 is located at an end that is of the fourth side wall 3314 and that is close to the second side wall 3312. An inner wall that is of the second groove 33141 and that is on a side close to the second side wall 3312 has a second slope 33142, and the second slope 33142 gradually tilts toward the second side wall 3312 along a direction from a groove opening to a bottom of the second groove 33141. When the first terminal module 332 on a side of the fourth side wall 3314 is installed into the first housing 331, a second connection section 33215 of each first terminal 3321 of the first terminal module 332 may extend into the second groove 33141, and a part of the second connection section 33215 extending into the second groove 33141 may abut against the second slope 33142 of the second groove 33141. For example, an included angle $\beta$ between the second slope 33142 and the first direction x may not be less than an included angle between the second connection section 33215 in a natural state and the first direction x. In this way, after the second connection section 33215 extends into the second groove 33141, surface contact can be formed between the second connection section 33215 and the second slope 33142, so that structural stability of the lower first terminal module 332 in the first housing 331 is improved. In addition, to reduce a risk of pin collapse of the lower first terminal 3321, the included angle $\beta$ between the second slope 33142 and the first direction x may also be designed to be not greater than 30°. Details are not described herein again.

As described above, when the plug-in card is inserted between the two first terminal modules 332 from the first opening 33111 of the second side wall 3312, two sides of the plug-in card may elastically abut against the corners of the upper and lower first terminals 3321 respectively. In this way, the first terminal 3321 is elastically deformed under a pressure of the plug-in card. It may be understood that the bending part 33213 of the upper first terminal 3321 is deformed upward away from the plug-in card. In this case, the second connection section 33215 of the upper first terminal 3321 moves to the bottom of the first groove 33131 under the guidance of the first slope 33132, and the second connection section 33215 of the lower first terminal 3321 moves to the bottom of the second groove 33141 under the guidance of the second slope 33142. It can be learned that, the slope design of the inner walls of the first groove 33131 and the second groove 33141 can prevent the first terminal 3321 from being stuck when moving in the corresponding groove, and ensure that the plug-in card can always maintain good electrical connection with the first terminal 3321 during insertion.

In addition, it can be learned from FIG. 5 that, after the plug-in card is electrically connected to the first terminal 3321, a signal on the plug-in card is transferred from a contact position A (for example, a corner of the bending part 33213) between the plug-in card and the first terminal 3321 to the first terminal 3321, then transferred to the first end 33211 of the first terminal 3321 along the first terminal 3321, and transferred to the mainboard through the cable. In this case, at the second end 33212 of the first terminal 3321, an electrical stub (electric stub) is formed on the first terminal 3321 from the contact position A between the first terminal 3321 and the plug-in card to an endpoint of the second end 33212. It may be understood that a length of the electrical stub is a length of the second connection section 33215. In this embodiment, because the second end 33212 of the first terminal 3321 is designed to be of a simple angular structure, a length of the formed electrical stub can be significantly reduced, to help increase bandwidth of the first connector 330.

Figure 7:
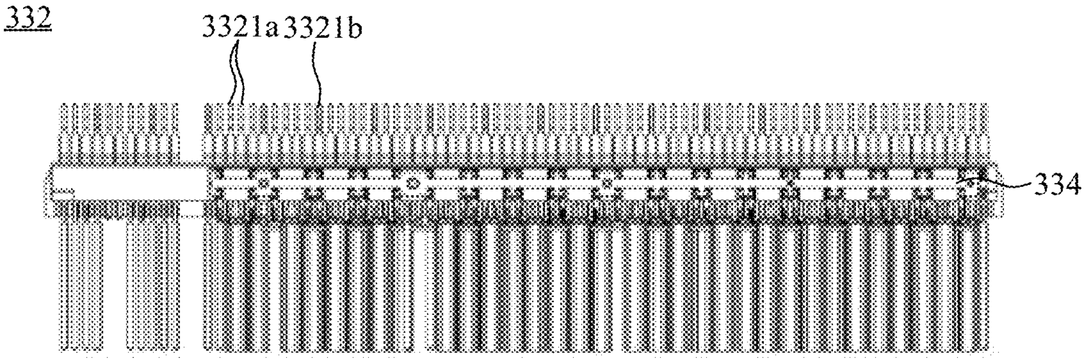
FIG. 7 is a side view of a first terminal module according to an embodiment of this application.
Figure 8:
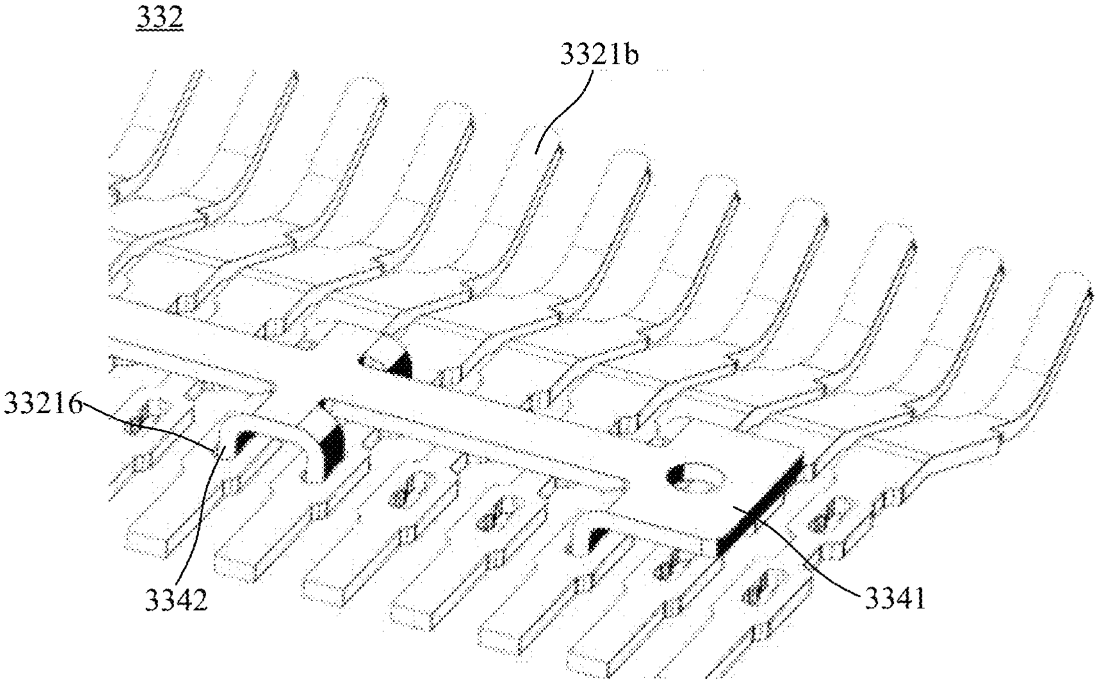
FIG. 8 is a schematic diagram of a partial structure of a first terminal module according to an embodiment of this application.

FIG. 7 is a side view of a first terminal module according to an embodiment of this application, and FIG. 8 is a schematic diagram of a partial structure of a first terminal module according to an embodiment of this application. Referring to FIG. 7 and FIG. 8, the plurality of first terminals 3321 of the first terminal module 332 include a signal terminal 3321*a* for transmitting a high-speed signal and a ground terminal 3321*b* for grounding. The ground terminal 3321*b* may be alternately disposed between signal terminals 3321*a*, for example, as shown in FIG. 7, one or two ground terminals 3321*b* may be disposed between each pair of signal terminals 3321*a*, to form a shielding function between adjacent high-speed signal pairs, and avoid interference between the high-speed signal pairs. In addition, in addition to the signal terminal 3321*a* and the ground terminal 3321*b*, the first terminal 3321 may further include one or more detection terminals. After the plug-in card is inserted into the first connector, whether the card is inserted in position may be detected based on a status of connection between the detection terminal and the plug-in card.

During an example disposition, a plug-in hole 33216 may be disposed on the ground terminal 3321*b*, a grounding assembly 334 is disposed on one side of the first terminal module 332, the grounding assembly 334 may include a support 3341 and a plurality of plug-in parts 3342 disposed on the support 3341, and these plug-in parts 3342 may be inserted into plug-in holes 33216 of the ground terminals 3321*b* in a one-to-one correspondence, so that each ground terminal 3321*b* is electrically connected to the grounding assembly 334, to implement electrical connection between the ground terminals 3321*b*, so that signal reflow can be optimized, and crosstalk can be reduced. In addition, the grounding assembly 334 connects the ground terminals 3321*b*. During manufacturing and processing, it is only needed to directly crimp the grounding assembly 334 on the first terminal module 332 to ensure good contact with the ground terminals 3321*b*, and it is not needed to additionally detect whether the grounding is proper, to help reduce processing costs.

For example, two plug-in holes 33216 may be disposed on each ground terminal 3321*b*. In this way, the grounding assembly 334 can be electrically connected to each ground terminal 3321*b* by using the two plug-in parts 3342. In an example, reliability of electrical connection between the ground terminals 3321*b* can be improved.

Figure 9:
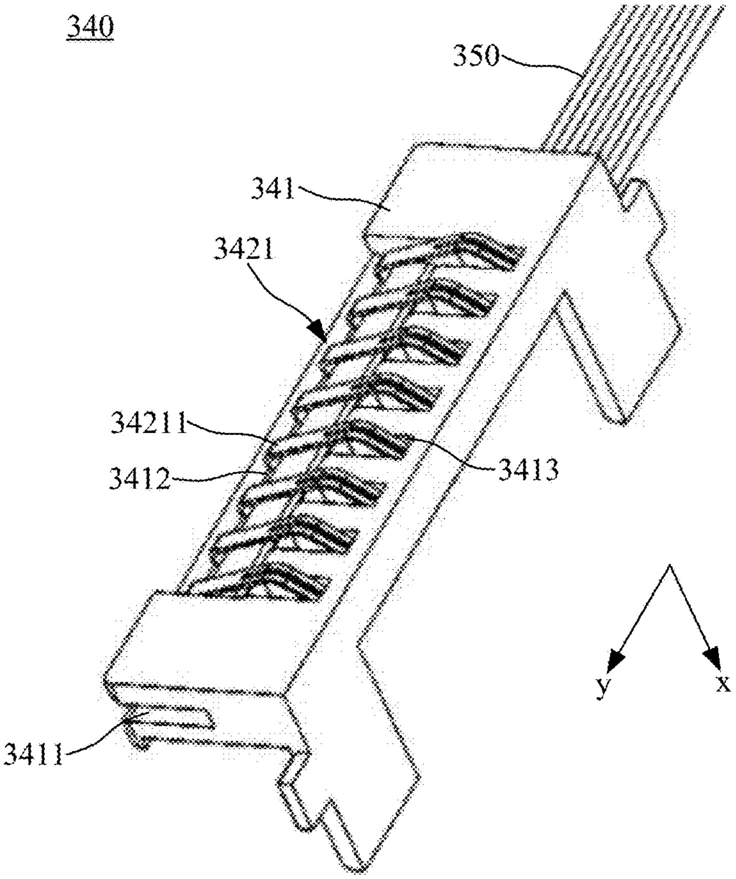
FIG. 9 is a schematic diagram of a structure of a second connector according to an embodiment of this application.

FIG. 9 is a schematic diagram of a structure of a second connector according to an embodiment of this application. Referring to FIG. 9, the second connector 340 may include a second housing 341 and a second terminal module. The second housing 341 may also be made of a plastic material, the second housing 341 may be disposed in the card slot 33113 of the extension part 33112 shown in FIG. 4, and a height of the second housing 341 may be approximately the same as a height of the extension part 33112, that is, the second housing 41 and the extension part 33112 may be disposed to share a same surface. For example, a block 33114 may be disposed on an inner wall of the card slot 33113, and a bayonet 3411 correspondingly clamped with the block 33114 may be disposed on the second housing 341. The second housing 341 may be fastened in the card slot 33113 by using the cooperative clamping between the block 33114 and the bayonet 3411. The second terminal module is disposed in the second housing 341. The second terminal module may include a plurality of second terminals 3421 disposed in parallel along the second direction. A first end and a second end of the second terminal 3421 respectively extend toward two side walls that are of the second housing 341 and that are disposed oppositely along the first direction x. A second opening (not shown in the figure) is disposed on a side wall that is of the second housing 341 and that is on a side corresponding to the first end of the second terminal 3421, and the first end of the second terminal 3421 may be welded to the cable 350 at the second opening, to be connected to the mainboard side through the cable 350. A third opening 3412 corresponding to each second terminal 3421 is disposed on a side wall that is of the second housing 341 and that is on a side corresponding to the second end of the second terminal 3421, and the second end of the second terminal 3421 may extend out of the second housing 341 through the corresponding third opening 3412 and be electrically connected to the circuit board.

During an example implementation, the second end of the second terminal 3421 has a second bending part 34211, and the second bending part 34211 extends out through the third opening 3412 and bends toward a side away from the first connector. Alternatively, the second bending part 34211 may be of an angular structure, and a corner of the second bending part 34211 may protrude from a side wall surface of the second housing 341. In some possible implementations, a fourth opening 3413 may be further disposed on a side wall that is of the second housing 341 and that is on a side corresponding to the second end of the second terminal 3421, the fourth opening 3413 is disposed in a one-to-one correspondence with the third opening 3412, and the fourth opening 3413 is located on a side that is of the third opening 3412 and that is away from the first connector. A tail end of the second bending part 34211 may be inserted into a corresponding fourth opening 3413. When the second terminal 3421 is elastically deformed due to pressure, the tail end of the second bending part 34211 may further move towards a bottom of the fourth opening 3413.

Figure 10:
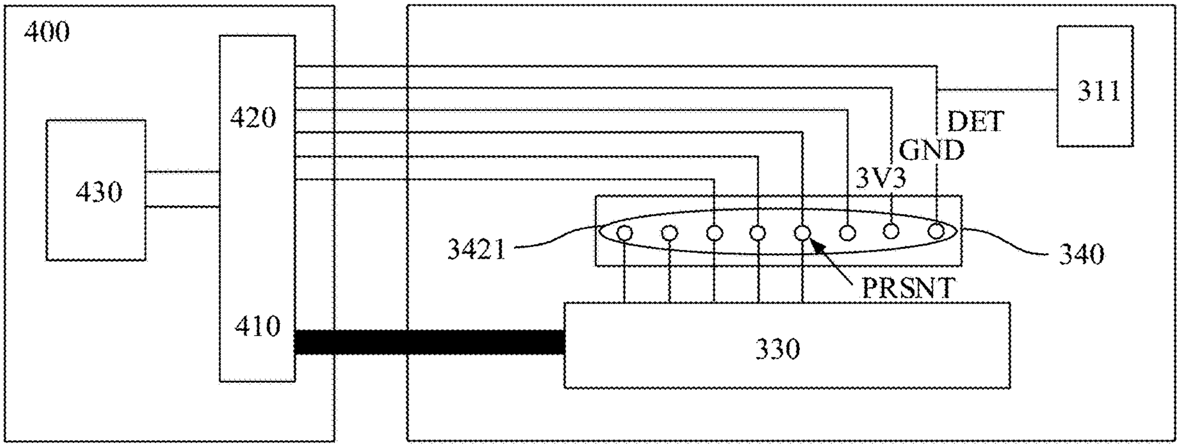
FIG. 10 is a schematic diagram of a connection status of a second terminal of a second connector according to an embodiment of this application.

FIG. 10 is a schematic diagram of a connection status of a second terminal of a second connector according to an embodiment of this application. Referring to FIG. 10, in this embodiment of this application, a quantity of second terminals 3421 of the second connector 340 is not limited. In FIG. 10, an example in which there are eight second terminals 3421 are used for description. During an example disposition, a second end of one second terminal DET may be electrically connected to the storage chip 311 of the circuit board 310, to obtain ID information of the first connector 330, and transmit the ID information of the first connector 330 to the mainboard 400 through the cable. A control chip 430 on the mainboard 400 may compare the ID information of the first connector 330 with ID information of a currently connected first pairing connector 410, to detect whether the first connectors 330 and the first pairing connector 410 at two ends of the cable match.

In some embodiments, the second terminal 3421 may further include a terminal, for example, a second terminal PRSNT shown in FIG. 10, configured to assist in detecting whether the plug-in card is inserted in position. In addition to being connected to the mainboard 400 side through the cable, a first end of the second terminal PRSNT may also be connected to a corresponding detection terminal on the first connector 330, to transmit a current signal of the detection terminal of the first connector 330 to the mainboard 400. The control chip 430 of the mainboard 400 may determine, based on the current signal of the detection terminal of the first connector 330, whether the plug-in card is inserted in position. During an example disposition, the first end of the second terminal PRSNT may be designed to be bifurcated, where one branch is connected to the cable, and the other branch is connected to the detection terminal of the first connector.

It should be noted that, other several second terminals 3421 of the second connector 340 may further include a ground terminal GND, a power supply terminal 3V3, and the like. First ends of these second terminals 3421 are respectively connected to corresponding lines on the mainboard 400 side through cables, and second ends are connected to the circuit board 310. For example, a first end of the ground terminal GND may be connected to a ground cable of the mainboard 400 through the cable, to meet a grounding requirement of the circuit board 310 on the expansion card 300 side; and a first end of the power supply terminal 3V3 may be connected to a power supply line of the mainboard 400 through the cable, to supply power to the circuit board 310 on the expansion card 300 side. Other unidentified second terminals 3421 may be used as data signal terminals and clock signal terminals to be connected to the mainboard 400 or the first connector 330, and are not described herein again.

Figure 11:
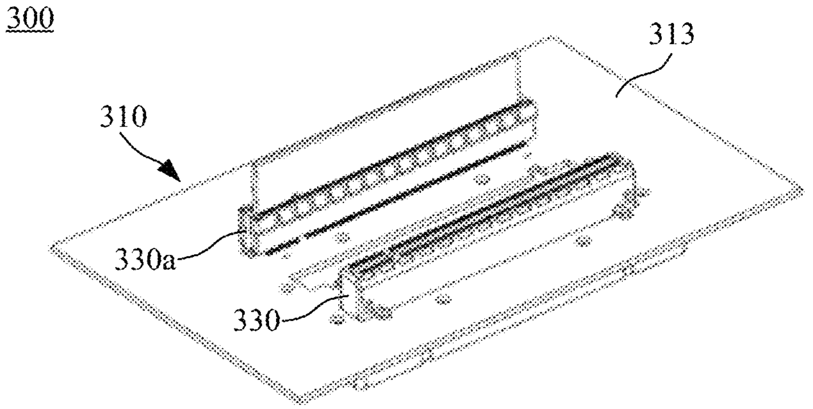
FIG. 11 is a schematic diagram of a structure of an expansion card according to an embodiment of this application.

FIG. 11 is a schematic diagram of a structure of an expansion card according to an embodiment of this application. Referring to FIG. 9 and FIG. 11, in this embodiment of this application, the circuit board 310 may include a first surface 312 and a second surface 313 that are disposed opposite to each other, and a through groove 314 that runs through the first surface 312 to the second surface 313 is disposed on the circuit board 310. A side that is of the base 360 and on which the first connector 330 and the second connector 340 are disposed may be disposed facing the first surface 312 of the circuit board 310. The first connector 330 may be exposed to the second surface 313 of the circuit board 310 through the through groove 314. The second connector 340 is fastened between the base 360 and the first surface 312 of the circuit board 310, and a side wall that is of the second housing 341 and that is on a side corresponding to the second end of the second terminal 3421 contacts the first surface 312 of the circuit board 310. The second bending part 34211 of the second terminal 3421 is elastically deformed under a pressure of the circuit board 310, so that a corner of the second bending part 34211 elastically abuts against the first surface 312 of the circuit board 310. A pad may be disposed at a position that is on the first surface 312 of the circuit board 310 and that is corresponding to the corner of the second bending part 34211. The second terminal 3421 is electrically connected to the circuit board 310 by contacting the pad, so that the second terminal 3421 can be electrically connected, through the cable, to a storage chip or another component disposed on the circuit board 310.

In some possible embodiments, the connector component 320 may be fastened to the circuit board 310 by using a fastener 370. During an example implementation, a plurality of first mounting holes may be disposed on the first housing, and second mounting holes 314 corresponding to the first mounting holes are disposed on the circuit board 310. The fastener 370 may be inserted into the first mounting hole after passing through the second mounting hole 314 from the second surface 313 of the circuit board 310, and is threaded to the first mounting hole, to lock the circuit board 310 and the connector component 320. During an example implementation, the first mounting hole may be processed into a threaded hole to implement threaded connection between the first mounting hole and the fastener 370, or a nut matching the fastener may be disposed in the first mounting hole, so that the fastener and the first mounting hole can also be locked.

Figure 12:
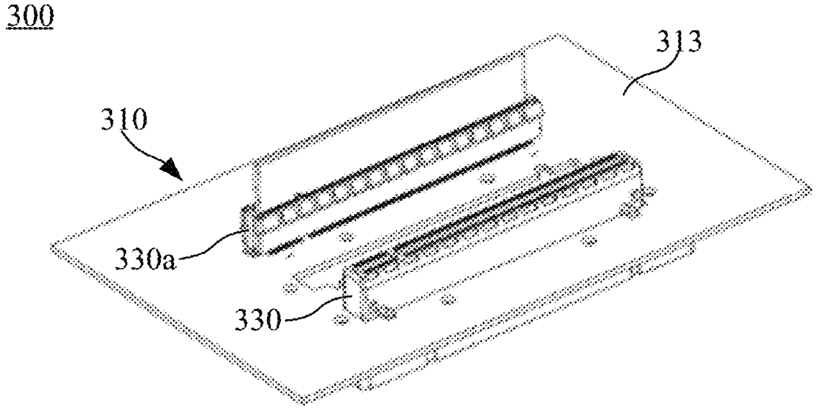
FIG. 12 is a schematic diagram of a structure of another expansion card according to an embodiment of this application.

FIG. 12 is a schematic diagram of a structure of another expansion card according to an embodiment of this application. Referring to FIG. 12, in some embodiments, the expansion card 300 may further be provided with a first connector, for example, a first connector 330*a* in FIG. 12, fastened on the circuit board in a surface mounting manner. In an example, solder paste may be printed on the second surface 313 of the circuit board 310, and first connectors 330*a* may be mounted on the solder paste on the second surface 313 of the circuit board 310 by using a surface mount system, and then the first connectors 330*a* are welded and fastened to the circuit board 310 by using a reflow soldering process. When the first connectors 330*a* are connected to the mainboard side, a wire may be disposed on the circuit board 310 for transfer. It should be noted that, in comparison with the first connector 330 integrated with the second connector in the foregoing connector component, signal rates of the surface-mounted first connectors 330*a* may be low, and in an example, a performance requirement of the circuit board 310 on which the transferring wire is disposed is low.

In a possible embodiment, heights of parts of the plurality of first connectors (including the first connectors 330 and 330*a*) that are on the expansion card 300 and that exceed the circuit board 310 may be approximately the same, and a specific height difference is allowed. For example, a height difference between parts that are of any two the first connectors and that exceed the circuit board 310 may be within a preset range. In this embodiment, solutions of both the surface-mounting connector and the integral connector component may be implemented on the expansion card 300 at the same time, so that product design is more flexible.

The following uses the connector component shown in FIG. 3 as an example to describe a manufacturing process of the connector component.

Step 1: First stamp one end of the plurality of first terminals 3321 on a terminal carrier to form the first bending part 33213, and then perform injection molding on the terminal carrier to form the first terminal module 332.

Step 2: Retain a connection carrier between a plurality of low-speed terminals on the first terminal module 332, and cut off a redundant carrier connected between remaining first terminals 3321, where the low-speed terminals between which the connection carrier is retained include but are not limited to the detection terminal described above.

Step 3: As shown in FIG. 7, fix the grounding assembly 334 on one side of the first terminal module 332, to implement electrical connection between the plurality of ground terminals 3321*b* on the first terminal module 332.

Step 4: Solder the cable at first ends of the plurality of first terminals 3321 of the first terminal module 332, and perform injection molding at a solder joint between the first terminal 3321 and the cable, to protect the solder joint and ensure reliability of connection between the first terminal 3321 and the cable.

Step 5: Fasten two first terminal modules 332, so that the two first terminal modules 332 are fixed, and the slot is formed between the two first terminal modules 332.

Step 6: As shown in FIG. 4, install the two first terminal modules 33 into the first housing 331.

Step 7: As shown in FIG. 3, install the second connector 340, to which the cable 350 is welded in advance, in the card slot of the first housing 331, to form the integrated connector component 320, and then, connect the two second terminals 3421 that are on the second connector 340 and that are used to implement matching detection to the first terminal 3321 corresponding to the first connector 330.

Step 8: Form the base 360 for accommodating the cable 350 by performing injection molding on a side of the first side wall 3311 of the first housing 331, where one end of the base 360 has a hole, and the cable 350 may extend out of the base 360 through the hole.

Figure 13:
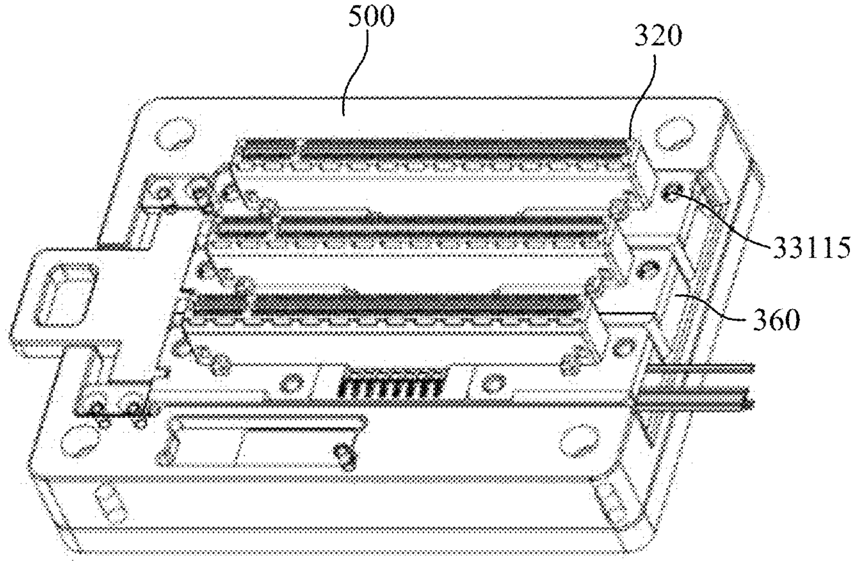
FIG. 13 is a schematic diagram 1 of an assembly procedure of an expansion card according to an embodiment of this application.
Figure 14:
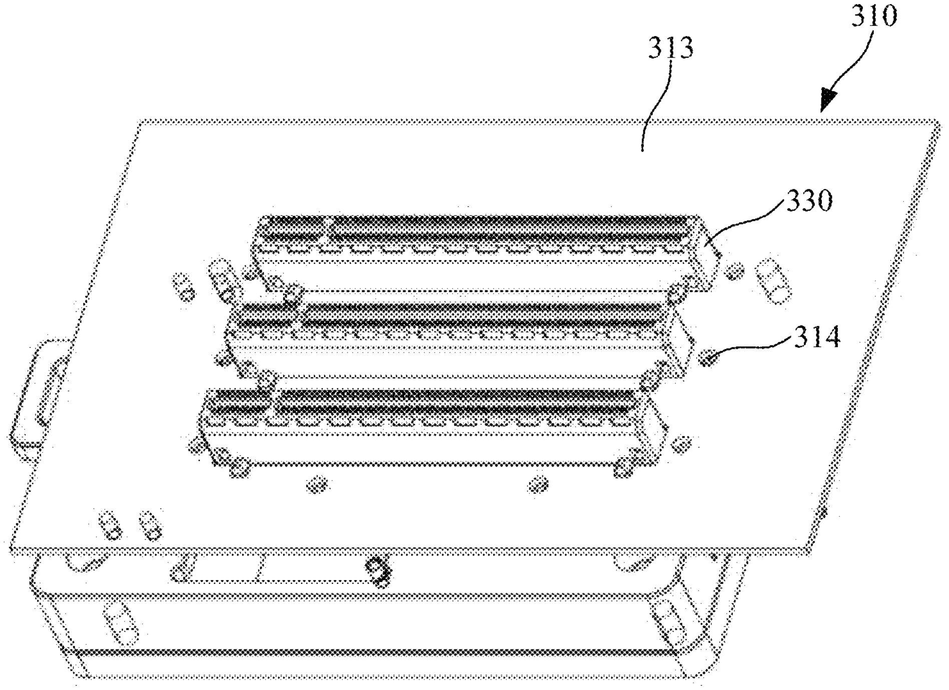
FIG. 14 is a schematic diagram 2 of an assembly procedure of an expansion card according to an embodiment of this application.
Figure 15:
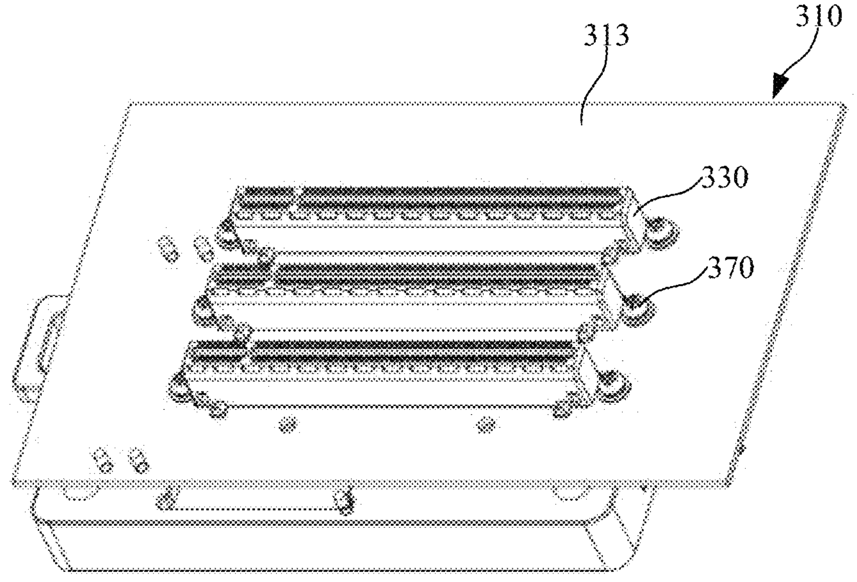
FIG. 15 is a schematic diagram 3 of an assembly procedure of an expansion card according to an embodiment of this application.

After the connector component 320 is manufactured, the connector component 320 and the circuit board 310 are assembled to obtain the expansion card. The following describes a process of assembling the connector component 320 and the circuit board 310 with reference to FIG. 13 to FIG. 15.

First, a plurality of connector components 320 to be installed on a same expansion card are fastened to a fixture 500. In FIG. 10, three connector components 320 are used as an example for description. A manner of fixing the connector component 320 and the fixture 500 is not limited. For example, the connector component 320 and the fixture 500 may be connected by using a fastener, to facilitate installation and disassembly between the connector component 320 and the fixture 500.

Then, a through groove of the circuit board 310 is aligned with the first connector 330 of each connector component 320, so that the first connector 330 runs through the corresponding through groove from the first surface of the circuit board 310 and is exposed to the second surface 313 of the circuit board 310, and the second connector 340 is fastened between the base 360 and the circuit board 310.

Finally, the fastener is inserted into a first mounting hole 33115 of the first connector 330 through the second surface 313 of the circuit board 310 through a second mounting hole 314, and is threaded to the first mounting hole 33115, to lock and fix the connector component 320 and the circuit board 310. The second terminal of the second connector 340 may be electrically connected by elastically abutting against the pad of the second surface 313 of the circuit board 310. After all the connector components 320 are fastened to the circuit board 310, the connector components 320 are taken out from the fixture 500, to obtain a completely assembled expansion card.

The foregoing descriptions are example implementations of this application, and are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An expansion card, comprising:

a circuit board;

a connector component comprising:

a first connector disposed on the circuit board, comprising first terminals, a first housing fastened to the circuit board, first terminal systems disposed at an interval in the first housing and forming a slot, and configured to connect to a plug-in card, wherein the slot is configured for disposing the plug-in card between the first terminal systems; and a second connector disposed on the circuit board, fastened to the first connector, and comprising second terminals; and a cable comprising:

a first end directly and separately welded to the first terminals and to the second terminals; and a second end configured to be electrically connected to a first pairing connector and a second pairing connector of a mainboard, wherein the first terminal systems comprise third terminals, wherein the third terminals comprise first ends and second ends, wherein the first ends are welded to the cable, wherein the second ends comprise first bending parts, wherein the first bending parts comprise first connection sections and second connection sections that are successively disposed away from the first ends, wherein the first connection sections and the second connection sections are disposed at first included angles, and wherein the first included angles of respective first bending parts of the first terminal systems are disposed opposite to each other.

2. The expansion card of claim 1, further comprising a storage chip disposed on the circuit board, wherein the storage chip is configured to store a first identifier (ID) information of the first connector, and wherein the second connector is electrically connected to the storage chip and is configured to transmit the first ID information to the mainboard through the cable.

3. The expansion card of claim 1, wherein the first housing comprises:

a first side wall;

a second side wall that is oppositely disposed to the first side wall;

a third side wall comprising a first inner surface and a first groove, wherein the first groove is disposed on the first inner surface; and a fourth side wall that is oppositely disposed to the third side wall, wherein the fourth side wall comprises a second inner surface and a second groove, wherein the second groove is disposed on the second inner surface, wherein the first terminal systems are respectively disposed close to the third side wall and the fourth side wall, wherein the first ends and the second ends of the second terminals respectively extend toward the first side wall and the second side wall, wherein a third connection section of the third terminals of each of the first terminal systems on the third side wall extends into the first groove, and wherein a fourth connection section of a fourth terminal of each of the first terminal systems on the fourth side wall extends into the second groove.

4. The expansion card of claim 3, wherein the first groove comprises a first inner wall that is on a first side close to the second side wall, wherein the first inner wall comprises a first slope facing the second side wall, wherein the second groove comprises a second inner wall that is on a second side close to the second side wall, wherein the second inner wall comprises a second slope facing the second side wall, wherein the first slope abuts against the third connection section that extends into the first groove, and wherein the second slope abuts against the fourth connection section that extends into the second groove.

5. The expansion card of claim 4, further comprising a third included angle that is between the first slope and a first direction and that is less than or equal to 30 degrees (°) or a fourth included angle that is between the second slope and the first direction and that is less than or equal to 30°, wherein the first direction is an extension direction of the first terminals.

6. The expansion card of claim 1, wherein each of the second terminals comprises a plurality of ground terminals and plug-in holes that are disposed on the ground terminals, wherein each of the first terminal systems further comprise a grounding assembly, wherein the grounding assembly comprises a support and a plurality of plug-in parts disposed on one side of the support, and wherein the plug-in parts are inserted into respective plug-in holes of the ground terminals.

7. The expansion card of claim 1, wherein the first housing comprises a first side, wherein the second connector comprises:

a second housing that is fastened to the first side and comprises a second housing surface; and a plurality of second terminals disposed in the second housing, wherein the second terminals comprise a third end that is welded to the cable, and wherein the third end protrudes from the second housing surface.

8. The expansion card of claim 7, wherein the circuit board comprises:

a first surface;

a second surface opposite to the first surface;

a through groove that runs through the first surface to the second surface and that is disposed on the circuit board; and a pad that is disposed on the first surface, wherein the first connector runs through the through groove from the first surface and is exposed to the second surface, wherein the second connector is located on the first surface, and wherein the third end is disposed toward the first surface and elastically abuts against the pad.

9. The expansion card of claim 8, wherein the connector component further comprises a base that is separately fastened to the first housing and to the second housing, wherein the base comprises an accommodating cavity and a hole that is configured to connect the accommodating cavity to an exterior of the expansion card, wherein the first end and the third end are separately disposed toward the accommodating cavity, wherein the first end extends into the accommodating cavity and is welded to the first terminals and the second terminals, and wherein the second end extends through the hole.

10. The expansion card of claim 9, wherein the base is located on the first surface and is fastened to the circuit board, and wherein the second connector is fastened between the base and the circuit board.

11. The expansion card of claim 1, further comprising a plurality of the first connector, wherein a height difference of any two of the plurality of the first connector and that exceed the circuit board falls within a preset range.

12. The expansion card of claim 1, wherein the first connector is a Card Electromechanical (CEM) connector.

13. A system, comprising:

a mainboard, comprising:

a first pairing connector disposed on the mainboard; and a second pairing connector disposed on the mainboard; and an expansion card comprising:

a circuit board, a connector component, comprising:

a first connector disposed on the circuit board comprising first terminals, a first housing fastened to the circuit board, and first terminal systems disposed at an interval in the first housing and forming a slot, and configured to electrically connect to a plug-in card and connect to the first pairing connector, wherein the slot is configured for disposing the plug-in card between the first terminal systems; and a second connector disposed on the circuit board, fastened to the first connector, and comprising second terminals, wherein the second connector is connected to the second pairing connector; and a cable that connects the first connector to the first pairing connector and connects the second connector to the second pairing connector, wherein the cable comprises:

a first end directly and separately welded to the first terminals and to the second terminals; and a second end electrically connected to the first pairing connector and the second pairing connector, wherein the first terminal systems comprise third terminals, wherein the third terminals comprise first ends and second ends, wherein the first ends are welded to the cable, wherein the second ends comprise first bending parts, wherein the first bending parts comprise first connection sections and second connection sections that are successively disposed away from the first ends, wherein the first connection sections and the second connection sections are disposed at first included angles, and wherein the first included angles of respective first bending parts of the first terminal systems are disposed opposite to each other.

14. The system of claim 13, wherein the first pairing connector and the second pairing connector are of an integrated structure.

15. The system of claim 13, wherein the first pairing connector and the second pairing connector are disposed independently.

16. A server, comprising:

a cabinet; and an expansion card disposed in the cabinet, wherein the expansion card comprises:

a circuit board, a connector component comprising:

a first connector comprising first terminals, a first housing fastened to the circuit board, and first terminal systems disposed at an interval in the first housing and forming a slot, wherein the first connector is configured to connect to a plug-in card, and wherein the slot is configured for disposing the plug-in card between the first terminal systems; and a second connector comprising second terminals, wherein the first connector and the second connector are fastened together and are disposed on the circuit board, and a cable comprising a first end and a second end, wherein the first end is directly and separately welded to the first terminals and to the second terminals, and wherein the second end is configured to be electrically connected to a first pairing connector and a second pairing connector of a mainboard, wherein the first terminal systems comprise third terminals, wherein the third terminals comprise first ends and second ends, wherein the first ends are welded to the cable, wherein the second ends comprise first bending parts, wherein the first bending parts comprise first connection sections and second connection sections that are successively disposed away from the first ends, wherein the first connection sections and the second connection sections are disposed at first included angles, and wherein the first included angles of respective first bending parts of the first terminal systems are disposed opposite to each other.

17. The server of claim 16, further comprising the mainboard and comprising:

the first pairing connector disposed on the mainboard and connected to the first connector through the cable; and the second pairing connector disposed on the mainboard and connected to the second connector through the cable.

18. The server of claim 17, wherein the first pairing connector and the second pairing connector are of an integrated structure.

19. The server of claim 16, wherein the expansion card further comprises a storage chip disposed on the circuit board, wherein the storage chip is configured to store a first identifier (ID) information of the first connector, and wherein the second connector is electrically connected to the storage chip and is configured to transmit the first ID information to the mainboard through the cable.

20. The server of claim 16, wherein the first housing comprises:

a first side wall;

a second side wall that is oppositely disposed to the first side wall;

a third side wall comprising a first inner surface and a first groove, wherein the first groove is disposed on the first inner surface; and a fourth side wall that is oppositely disposed to the third side wall, wherein the fourth side wall comprises a second inner surface and a second groove, wherein the second groove is disposed on the second inner surface, wherein the first terminal systems are respectively disposed close to the third side wall and the fourth side wall, wherein the first ends and the second ends of the second terminals respectively extend toward the first side wall and the second side wall, wherein a third connection section of the third terminals of each of the first terminal systems on the third side wall extends into the first groove, and wherein a fourth connection section of a fourth terminal of each of the first terminal systems on the fourth side wall extends into the second groove.

* * * * *